US008859144B2

(12) United States Patent
Xiao (10) Patent No.: US 8,859,144 B2
(45) Date of Patent: Oct. 14, 2014

(54) MULTI-PHASE SEPARATED SILICON BASED ALLOYS AS NEGATIVE ELECTRODE MATERIAL FOR LITHIUM BATTERIES

(71) Applicant: GM Global Technology Operations LLC, Detroit, MI (US)

(72) Inventor: Xingcheng Xiao, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 14/151,868

(22) Filed: Jan. 10, 2014

(65) Prior Publication Data

US 2014/0127573 A1  May 8, 2014

Related U.S. Application Data

(63) Continuation-in-part of application No. 13/234,209, filed on Sep. 16, 2011.

(51) Int. Cl.
| | |
|---|---|
| *H01M 4/13* | (2010.01) |
| *H01M 4/134* | (2010.01) |
| *H01M 4/38* | (2006.01) |
| *H01M 4/04* | (2006.01) |
| *H01M 4/1395* | (2010.01) |
| *H01B 1/04* | (2006.01) |
| *B82Y 30/00* | (2011.01) |
| *H01B 1/08* | (2006.01) |

(52) U.S. Cl.
CPC ............ *H01M 4/0426* (2013.01); *H01M 4/134* (2013.01); *H01M 4/387* (2013.01); *H01M 4/0483* (2013.01); *H01B 1/04* (2013.01); *B82Y 30/00* (2013.01); *Y02E 60/122* (2013.01); *H01M 4/1395* (2013.01); *H01B 1/08* (2013.01); *H01M 4/386* (2013.01)
USPC .................................. 429/218.1; 429/231.95

(58) Field of Classification Search
CPC ..... H01M 4/134; H01M 4/386; H01M 4/387; H01M 4/0423; H01M 10/052
USPC ......................................... 429/218.1, 231.95
See application file for complete search history.

(56) References Cited

U.S. PATENT DOCUMENTS

| | | | | |
|---|---|---|---|---|
| 2002/0162606 | A1* | 11/2002 | Turner et al. | ................... 148/403 |
| 2005/0130043 | A1* | 6/2005 | Gao et al. | ................. 429/231.95 |
| 2007/0020521 | A1* | 1/2007 | Obrovac et al. | ............ 429/218.1 |
| 2009/0061322 | A1* | 3/2009 | Kawakami et al. | ....... 429/231.95 |
| 2010/0119942 | A1* | 5/2010 | Kumar | ........................... 429/220 |

* cited by examiner

*Primary Examiner* — Zachary Best
(74) *Attorney, Agent, or Firm* — Reising Ethington P.C.

(57) ABSTRACT

A particulate composite of silicon, tin, and aluminum (or other suitable metal) is prepared as a negative electrode composition with increased lithium insertion capacity and durability for use with a metal current collector in cells of a lithium-ion battery or a lithium-sulfur battery. This electrode material is formed such that the silicon is present as a distinct amorphous phase in separate matrix phases of crystalline tin and crystalline aluminum. While the distinct tin and aluminum phases provide electron conductivity, each phase accommodates the insertion and extraction of lithium in the operation of the cell and all phases interact in minimizing mechanical damage to the material as the cell experiences repeated charge and discharge cycles. Other suitable metals for use in the composite with silicon and tin include copper and titanium.

18 Claims, 4 Drawing Sheets

MULTI-PHASE SEPARATED SILICON BASED ALLOYS AS NEGATIVE ELECTRODE MATERIAL FOR LITHIUM BATTERIES

This application is a continuation-in-part of Ser. No. 13/234,209, filed on Sep. 16, 2011, titled "Phase Separated Silicon-Tin Composite as Negative Electrode Material for Lithium-Ion Batteries," now U.S. Patent Application Publication No. 2013-0071736. The complete contents of that application are incorporated herein by reference.

TECHNICAL FIELD

This invention pertains to the preparation of negative electrode materials that are suitable for batteries using lithium electrodes, such as lithium-ion batteries and lithium-sulfur batteries. More specifically, this invention pertains to the preparation and use of composite compositions that contain nanometer-scale islands of amorphous silicon phases embedded in separate crystalline or amorphous nanometer-size phases of tin and of another metal, such as aluminum, copper, or titanium. Such composite compositions may be prepared as particles by a rapid solidification process and used as negative electrode material for cyclic insertion and extraction of lithium in the operation of lithium batteries. The combination of suitable atomic proportions of silicon, tin, and at least one other metal element, and the sizes of the respective phases in such composites enables the insertion of increased amounts of lithium over repeated electrochemical cycles with less damage to the particulate negative electrode material.

BACKGROUND OF THE INVENTION

Lithium-ion batteries are used as electric storage systems for powering electric and hybrid electric vehicles. These batteries comprise a plurality of suitably interconnected electrochemical cells arranged to provide a predetermined electrical current at a specified electrical potential. In each such cell, lithium is transported as lithium ions from a negative electrode through a non-aqueous, lithium-containing, electrolyte solution to a lithium-ion-accepting positive electrode as an electronic current is delivered from the battery to an external load, such as an electric traction motor. A suitable porous separator material, infiltrated with the electrolyte solution and permeable to the transport of lithium ions in the electrolyte, is employed to prevent short-circuiting physical contact between the electrodes. Graphite has been used as a negative electrode material and bonded in a thin electrode layer on a copper current collector. During charging of the cells, lithium is inserted into the graphite (lithiation, forming $LiC_6$, about 372 mAh/g) and extracted from the graphitic carbon during discharging (delithiation). A suitable particulate material for receiving and storing inserted lithium during discharge of each cell is used as the positive electrode material. Examples of such positive electrode materials include lithium cobalt oxide ($LiCoO_2$), a spinel lithium transition metal oxide such as spinel lithium manganese oxide ($LiMn_XO_Y$), a lithium polyanion such as a nickel-manganese-cobalt oxide [$Li(Ni_XMn_YCo_Z)O_2$], lithium iron phosphate ($LiFePO_4$), or lithium fluorophosphate ($Li_2FePO_4F$), or a mixture of any of these materials. Suitable positive electrode materials are often bonded as a thin layer to an aluminum current collector. The electrochemical potential of such lithium ion cells is typically in the range of about 2 to 4.5 volts.

The use of lithium-ion batteries to power electric motors in automotive vehicles has led to the need for higher gravimetric and/or volumetric capacity batteries. While graphitic carbon is a durable and useful lithium-intercalating, negative electrode material for lithium-ion cells, it has a relatively low capacity for such lithium insertion. Other potential negative electrode materials such as silicon (theoretical capacity, 3600 mAh/g, for $Li_{15}Si_4$) and tin (theoretical capacity, 992 mAh/g, for $Li_{22}Sn_5$) have much higher theoretical capacities than graphite for lithium insertion. However, the volume change of up to 300 volume percent for silicon during lithiation and delithiation processes leads to fracture of the active silicon material and/or loss of electrical contact with the conductive additives or the current collectors. And tin has the same problem of a large volume expansion upon lithiation, leading to rapid capacity degradation.

Lithium-sulfur batteries, like lithium-ion batteries, are rechargeable. They are also notable for their high energy density. The low atomic weight of lithium and the moderate atomic weight of sulfur enable lithium-sulfur batteries to be relatively light in weight. Like lithium-ion cells, the anode or negative electrode of the lithium-sulfur cell requires lithium. During lithium-sulfur cell discharge, lithium is dissolved into an electrolyte from the anode surface, transported in the electrolyte (e.g., a molten or liquid alkali metal polysulfide salt) through a porous separator to a cathode (positive electrode during cell discharge) which comprises a polysulfide (e.g., $S_8$). Upon reaching the cathode, lithium atoms progressively reduce the polysulfide to a lithium sulfur composition (e.g., $Li_2S_3$). The chemical changes are reversed when the lithium-sulfur cell is recharged. The light weight and high energy density of lithium-sulfur cells make lithium-sulfur batteries good candidates for vehicle propulsion systems and other electrical energy consuming devices.

The basic mechanism responsible for the loss of capacity of a battery due to fracture of the electrode materials in its cells is the loss of electrical contact with conductive material and the creation of new surfaces, which irreversibly consume the active lithium to form new solid electrolyte interfaces. Both problems shorten the effective cycling capacity of a battery. There remains a need for a more effective way or material form of utilizing silicon or tin in negative electrodes of lithium-ion cells.

SUMMARY OF THE INVENTION

In accordance with embodiments of this invention, an improved negative electrode material for a lithium battery is formed by combining elemental silicon (a metalloid element) with tin and with another metal element as intermixed, but immiscible, separate solid phases. The second metal element, to be combined with silicon and tin, is chosen to accommodate the diffusion of lithium into the mixture and to be substantially immiscible with both of the silicon and tin in the solid state. For example, elemental aluminum, copper, or titanium may be combined with silicon and tin in practices of this invention. Aluminum is preferred.

In a preferred embodiment, a particulate composite of silicon, tin, and aluminum (or a sputtered film composite) is formed in which the silicon, aluminum, and tin are each present as separate phases in each particle of the composite. The aluminum and tin phases are electrically conductive and each of the three phases is receptive to the insertion and extraction of lithium atoms. The composite is formed with a three-phase or multi-phase structure that is nanometer to micrometer in characteristic phase length or diameter (or characterizing dimension for the phase in the composite) and is achieved by controlling the synthesis process to produce the sizes of the mixed phases to be below the critical size for the generation of micro-cracks due to the repeated insertion of lithium into the mixed phases.

In a preferred embodiment, confined particulate architectures are formed wherein island-like silicon phases are separated in a matrix (or boundary layer) of a tin phase and of a separate aluminum phase (or other separate elemental metal phase, combined with the silicon and tin). The composite composition contains nanometer-scale islands of amorphous silicon phases dispersed in a matrix of a tin phase and a phase of a second element. The matrix phases may be crystalline or amorphous. But preferably the matrix phases consist of tin phase crystals and second metal element crystals each having a size in the range of twenty nanometers to fifty nanometers. Such a microstructure provides several advantages: (1) the tin phase and the aluminum phase are each electrically conductive, which enables electrons to reach the island-like silicon phase particles which can hold an abundance of lithium atoms, (2) the diffusion of lithium in tin and aluminum (or other metal element selected for use in combination with tin) is much faster than in silicon, which can reduce the concentration gradient of lithium ions through the larger composite particles of silicon, tin, and aluminum, in effect reducing the diffusion induced stress to mitigate the fracture of the larger composite particles, (3) if a crack is generated in the composite material, the relatively soft matrix phases of aluminum and tin tend to absorb the elastic strain energy and prevent any micro-cracks from propagating, and (4) the immiscible characteristics of silicon, aluminum, and tin, and their phase separation, minimizes electrochemical sintering and thus prevents coalescence of the particles that would otherwise lead to rapid mechanical degradation of the electrode material. Also, a thin layer of naturally formed oxide at the interfaces of the silicon phase and the metal phases (particularly on aluminum) can behave like a passivation layer and improve coulombic efficiency, and can prevent electrolyte decomposition and facilitate charge transfer to the surface of the composite electrode material.

Phase-separated particle composites in particle form may be produced, for example, by rapid solidification practices (e.g., melt spinning) from a homogeneous (or uniformly dispersed) liquid mixture of elemental aluminum, tin, and silicon. In another example, phase-separated composites may be formed by co-sputtering of separate sources of aluminum, tin, and silicon and co-depositing phase-separated mixtures of aluminum, tin, and silicon in predetermined proportions as an electrode film on a suitable surface, such as a copper current collector. In the event that the sputtered deposit is atomically uniform, phase separation of the silicon, tin, and second metal element may be obtained by heating the substrate (e.g., up to about 500° C.) or through another post annealing process.

In general, it is preferred to prepare a phase-separated composite consisting of about twenty to eighty atomic percent silicon, about twenty to sixty atomic percent tin, and about one to thirty atomic percent aluminum (and/or copper, titanium, or other suitable lithium-accepting metal element) for negative electrode materials for lithium-ion cells or lithium-sulfur cells.

In accordance with practices of the invention, the mechanical degradation that occurs when pure tin or pure silicon is used alone for lithium insertion is thus mitigated by tuning the Si/Sn/Al atomic ratio of the tin-silicon-aluminum composite. At suitable Si/Sn/Al ratios, phase separation occurs with amorphous phase clusters of silicon being embedded in matrix phases of crystalline or amorphous tin and of crystalline or amorphous aluminum. The resulting negative electrode materials exhibit significant improvements in charge storage capability for lithium, along with excellent cycling stability.

Thus, in accordance with practices of the invention, phase-separated composites of silicon, tin, and aluminum (or other second metal element) are formed as relatively thin layers on a suitable current collector foil or sheet for use as negative electrode material in the cells of a lithium-ion battery or of a lithium-sulfur battery. By thus using this phase-separated combination of silicon, tin, and aluminum, the lithium-insertion capacity of each cell is increased to improve the volumetric and/or gravimetric capacity of lithium-ion batteries or of lithium-sulfur batteries.

Other objects and advantages of the invention will be apparent from a detailed description of practices of embodiments of the invention which follows in this specification.

BRIEF DESCRIPTION OF THE DRAWINGS

FIG. 1 is an enlarged schematic illustration of a few electrochemical cells of an exemplary lithium-ion battery arrangement. Each cell includes a thin, rectangular negative electrode that may include the phase-separated, silicon, tin, and second metal composite material of this invention, a like-shaped positive electrode, and a separator sandwiched between the electrodes.

FIG. 2 also illustrates the metallic current collectors that support the respective electrode materials. The elements of the cell are shown separated for illustration, but they are actually in compressed face-to-face contact and the electrode materials are formed on, or bonded to, their respective current collectors.

DESCRIPTION OF PREFERRED EMBODIMENTS

Figure 1:
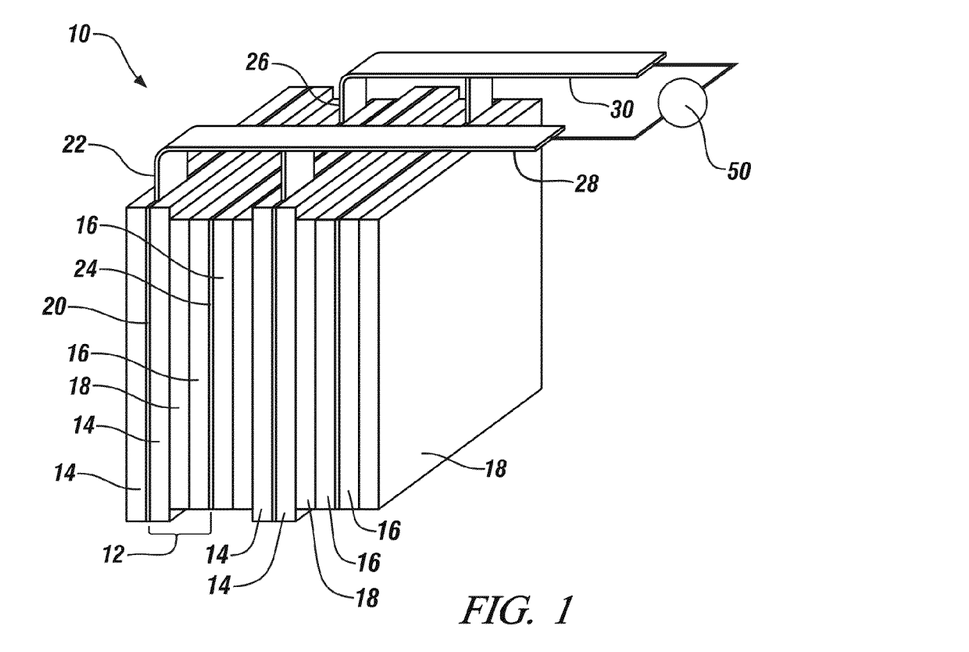

An exemplary and generalized illustration of a lithium-ion battery 10 is depicted in FIG. 1. The lithium-ion battery 10 shown here includes several thin rectangular-shaped electrochemical battery cells 12 that are each bracketed by metallic current collectors. The electrochemical battery cells 12 are stacked side-by-side in a modular configuration and, in this example, connected in parallel. A lithium-ion battery 10 may be formed of many like electrochemical cells in electrical series or in parallel connection to form a lithium ion battery that exhibits the voltage and current capacity demanded for a particular application. It should be understood the lithium ion battery 10 shown here is only a schematic illustration. FIG. 1 is presented to show the relative position and physical interactions of the various components that constitute the electrochemical battery cells 12 (i.e., the electrodes and the separator); it is not intended to inform the relative sizes of the electrochemical battery cells' components, to define the number of electrochemical battery cells 12 in the lithium ion battery 10, or to limit the wide variety of structural configurations the lithium ion battery 10 may assume.

The electrochemical cell 12 (one indicated) contained in the lithium ion battery 10 includes a negative electrode 14, a positive electrode 16, and the separator 18 situated between the two opposing electrodes 14, 16. Each of the negative electrode 14, the positive electrode 16, and the separator 18 is wetted with a liquid electrolyte solution that enables the transport of lithium ions between the electrodes 14, 16. A negative-electrode metallic current collector 20 (typically, copper) that includes a negative polarity tab 22 is located between the back-to-back negative electrodes 14 of adjacent electrochemical cells 12. Likewise, a positive-side metallic current collector 24 (typically, aluminum) that includes a positive polarity tab 26 is located between neighboring positive electrodes 16. The negative polarity tab 22 is electrically coupled to a negative terminal 28 and the positive polarity tab 26 is electrically coupled to a positive terminal 30. Each electrode material 14, 16 is typically formed on or bonded to its respective metallic current collector 20, 24. An applied compressive force usually presses the metallic current collectors 20, 24 and their electrodes 14, 16 against the separator 18 to achieve intimate interfacial contact between adjacent contacting components. Negative terminal 28 and positive terminal 30 are connected to an electrical power consuming load 50. For example, a suitable battery pack comprising many like individual cells may be provided to power an electric traction motor to drive the wheels in an automotive vehicle. In such a battery pack many cells are connected in groups in electrical parallel arrangement for providing suitable energy capacity and many groups are connected in series to provide a suitable electrical voltage potential.

Figure 2:
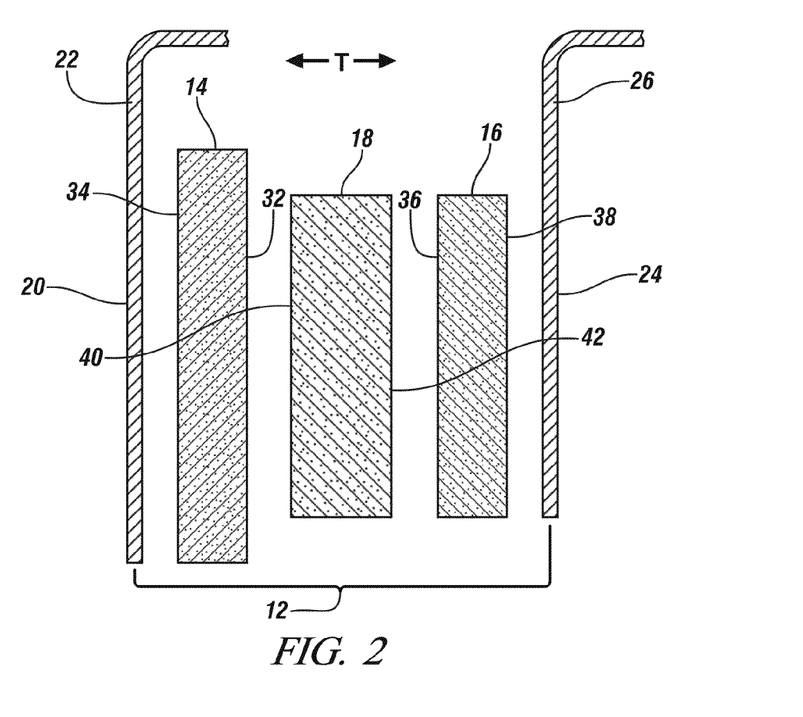
FIG. 2 is a further enlarged and exploded cross-sectional view of one of the electrochemical cells shown in FIG. 1.

An exploded cross-sectional view of the electrochemical battery cell 12 and its associated metallic current collectors 20, 24 is generally illustrated in FIG. 2. The negative electrode 14 includes an inner face surface 32 and an outer face surface 34 relative to the location of the separator 18. The positive electrode 14 similarly includes an inner face surface 36 and an outer face surface 38. The inner face surface 32 of the negative electrode 14 may, but is not required to, encompass a larger two-dimensional surface area than the inner face surface 36 of the positive electrode 16, as shown. When assembled into the electrochemical battery cell 12, the inner face surfaces 32, 36 of the negative and positive electrodes 14, 16 confront one another and are pressed against a negative-side major face surface 40 and a positive-side major face surface 42 of the separator 18, respectively. Such pressed-engagement occurs generally uniformly along the entire interface of the major face surfaces 40, 42 of the separator 18 and the corresponding portions of the inner face surfaces 32, 36 of the electrodes 14, 16. The negative-side metallic current collector 20 is formed on or joined to the outer face surface 34 of the negative electrode 14 and the positive-side metallic current collector 24 is formed on or joined in electrical contact with the outer face surface 38 of the positive electrode 16. In many embodiments of this invention a composite tin-silicon negative electrode material is formed directly on the surfaces of a copper negative electrode current collector 20 Both of the metallic current collectors 20, 24 engage their respective electrode outer face surfaces 34, 38 over an appreciable interfacial surface area to facilitate the efficient collection and conduction of free electrons.

In many lithium-ion batteries the elements of electrochemical cells 12 are made of materials such that they are generally thin and flexible. By way of illustrative example, a typical thickness (T in FIG. 2) of the electrochemical cell 12 extending from the outer face surface 34 of the negative electrode 12 to the outer face surface 38 of the positive electrode 16 may about 80 µm to about 350 µm. Each electrode 14, 16 may be about 30 µm to 150 µm thick and the separator 18 may be about 20 µm to 50 µm thick. The metallic current collectors 20, 24 may be about 5 µm to 20 µm thick. The relatively thin and flexible nature of the elements of the electrochemical cell 12 and its associated metallic current collectors 20, 24 allows them to be rolled, folded, bent, or otherwise maneuvered into a variety of lithium-ion battery configurations depending on design specifications and spatial constraints. The lithium ion battery 10 may, for example, include a number of distinct electrochemical cells 12 that have been fabricated, cut, aligned, and laid-up next to one another or, in an alternative embodiment, the cells 12 may be derived from a continuous layer that is folded back-and-forth over itself many times.

While lithium-ion batteries have been continually developed and used, for example, to power traction motors and the like for automotive vehicles, lithium-sulfur batteries are now being considered for such applications. As described, lithium-sulfur cells also employ a lithium-containing negative electrode (anode), and electrode material, that functions electrochemically like the negative electrode of a lithium-ion cell or battery. Accordingly, the silicon-tin-second metal element compositions and microstructures described further in this specification are suitable for the intercalation of lithium whether the negative electrode material is used in a lithium-ion battery or in a lithium-sulfur battery. When a negative electrode is being prepared with a layer of the silicon-tin-aluminum (or other second metal) composites of this invention as the negative electrode material, it is necessary to provide for the introduction of a predetermined quantity of lithium into the electrode materials of the cell. In a preferred embodiment, a specified quantity of lithium may be incorporated (lithiated) into the silicon-tin composite material, for example, by electrochemical insertion, electroplating, vacuum deposition, or physical contact with lithium metal in the presence of a suitable electrolyte. In another embodiment, a suitable quantity of lithium may be introduced into the sulfur-containing positive electrode material before the assembly of the elements of the lithium-sulfur cell. During initial charging of the assembled cell or battery, lithium would be transported through the electrolyte and inserted into the composite silicon-tin negative electrode material.

Practices of this invention are directed to the formation of higher current capacity and more durable materials for negative electrodes of lithium-ion electrochemical cells. Phase-separated composites of silicon, tin, and a second metal, such as aluminum, copper, or titanium, are prepared for this purpose.

Composite compositions of fifty atomic percent silicon, twenty five atomic percent tin, and twenty five atomic percent of a second metal in elemental form (to complement the tin) were prepared. The second metals were aluminum, copper, or titanium. These composites are referred to, respectively, as $Si_{50}Sn_{25}Al_{25}$, $Si_{50}Sn_{25}Cu_{25}$, and $Si_{50}Sn_{25}Ti_{25}$. The respective composites were formed co-deposited as three element composite thin films in a Gamma 1000 sputtering system (Surrey Nanosystems, UK). In each preparation a roughened copper foil was used to provide good adhesion between the sputtered Si—Sn-second metal thin films and the copper current collector. The deposition plasma for each constituent material (Si, Sn, and Al or Cu or Ti) was created with RF (for silicon) and DC power (for the metal elements), respectively, applied to three magnetron guns under an argon flow of 14 sccm. The deposition rates of silicon, tin, and the second metal element were separately controlled to obtain the above specified different atomic proportions of these elements. The dynamic pressure during the growth of the films was 3 mTorr, and the substrate was kept at room temperature.

Ex situ X-ray diffraction (XRD) was used to study the structures of the thin films deposited on the Cu current collectors. All samples were examined using Cu Kα radiation in a Bruker AXS general area detector diffractometer system (GADDS). The diffraction images were collected for a period of 5 min with a 0.5-mm collimator and a sample-to-detector distance of 150 mm. The composition of each sample pad was determined by electron probe microanalysis (EPMA), while selected samples were characterized with JEOL 2100F AC transmission electron microscope operating at 200 kV. Scanning transmission electron microscopy (STEM) images were collected using a high angle annular dark field (HAADF) detector.

All electrochemical experiments were carried out in coin cells inside an argon-filled glove box at an ambient temperature (25° C.). Pure lithium metal was used for the counter electrode for the half-cell tests. The electrolyte solution was 1 M $LiPF_6$ in ethylene carbonate (EC) and dimethyl carbonate (DMC) (1:1 v/v) with 10% fluoroethylene carbonate additives. A Celgard 3501 (1 μm thick microporous polypropylene film with 40% porosity) was used as the separator. Galvanostatic tests for all samples were performed with an Arbin BT-2000 battery testing station at a cycling voltage between 10 mV to 1.5 V (relative to a $Li/Li^+$ electrode).

The XRD results included the strong Cu diffraction peaks observed from the substrate and revealed several Sn peaks, indicating that the Sn phase was crystalline. Depending on the specific sample, strong aluminum peaks, copper peaks, or titanium peaks were also observed. No Si diffraction peaks were detected, indicating the amorphous nature of the Si. This was expected since the deposition temperature is too low for Si to develop a crystalline phase. No peaks representing any other Si—Sn phase or Si—Al phase or Si—Cu phase, or Si—Ti phase were observed in any of the sputtered samples examined, which clearly demonstrated that the Si and the two metal constituents were phase-separated, in agreement with the known immiscibility of Si, Sn, Al, Cu, and Ti. This nanostructure induced by phase separation is very critical to significantly improve its electrochemical performance. The overall mechanism for this will be further described in this specification.

Based on the well-known Scherrer equation, the average Sn and Al crystallite size estimated from X-ray diffraction patterns was about 20 to 50 nm.

Figure 3:
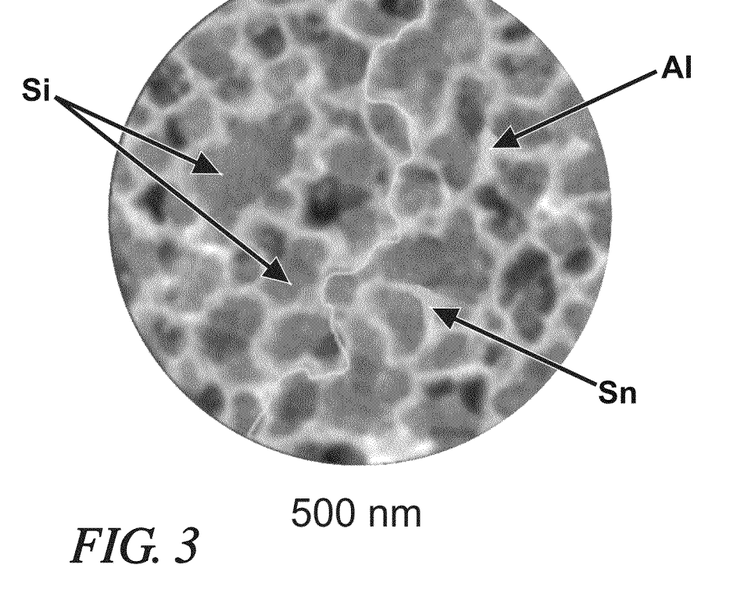
FIG. 3 is schematic illustration, based on a scanning electron microscope image (SEM) of a silicon-tin composite sample. The SEM image has been marked to illustrate the surface morphologies of a representative phase-separated composite of silicon, tin, and aluminum (for example, a $Si_{50}Sn_{25}Al_{25}$ composition where the subscripts state values of atomic percent of the constituent). The original silicon-tin composite sample was formed by sputtering of silicon and tin from separate sputter targets to form a film onto a copper strip substrate. Silicon is seen to be present as island-like phases in a matrix of an aluminum phase and the tin phase.

FIG. 3 is an SEM image of a sputtered silicon and tin composite which is marked and labeled schematically to illustrate the shapes and locations of the island-like shaped silicon phases and the tin and aluminum matrix phases. The dark, island-like clusters are the grains of the silicon phase. The lighter image boundary phases surrounding the silicon grains are a combination of separate shell-like microstructures, formed by the separate tin and aluminum phases. During the formation of the composite material, the aluminum and tin tend to wet the silicon particles and form a metal oxide layer at the interfaces of the phases. The presence of the metal oxide at the interfaces improves the efficiency of the first charge-discharge cycle as well as subsequent cycle stability. The SEM image is also marked with an added arbitrary fine white line, drawn through the matrix phases from the top of the image to the bottom. This added line indicates an unwanted microcrack in the composite material. That microcrack is not present and has been avoided by the illustrated composition and microstructure. Lithium diffuses faster in the tin and aluminum than in the silicon, which permits a more uniform distribution of the lithium in the composite. Less stress is generated in the composite structure due to a lower concentration gradient of the lithium. Microcracks are unwanted in the negative electrode material because they affect the function of the material.

Figure 4:
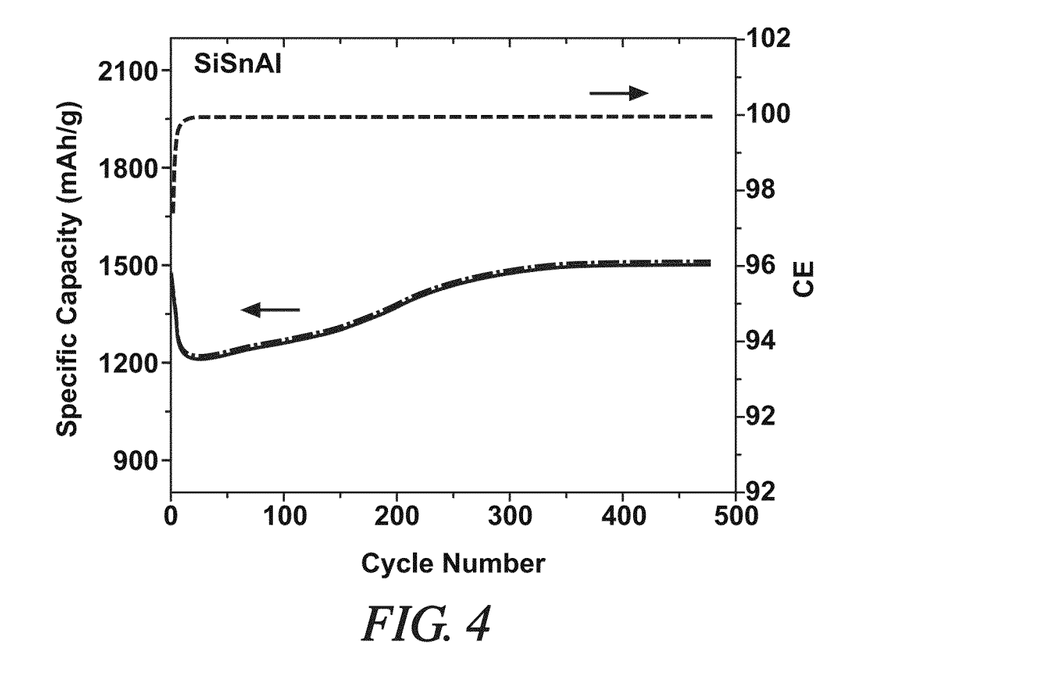
FIG. 4 is a graph of Specific Capacity (mAh/g) at the left vertical axis, and Coulombic Efficiency (CE) at the right vertical axis vs. Cycle Number, up to about 500 cell cycles, horizontal axis, for a composite of $Si_{50}Sn_{25}Al_{25}$ composition as anode material in a half-cell using pure lithium as the counter electrode. The electrolyte solution was 1 M $LiPF_6$ ethylene carbonate and dimethyl carbonate (1:1 v/v) with 10% fluoroethylene carbonate additive. The cycling was conducted at 25° C. The solid data line represents the data points for specific charge capacity (mAh/g). The long-short dashed line represents the data points for specific discharge capacity (mAh/g). And equal length dashed line represents the data points for CE.

A composite of $Si_{50}Sn_{25}Al_{25}$ composition was tested as the anode material in a half-cell using pure lithium as the counter electrode. The electrolyte solution was 1 M $LiPF_6$ ethylene carbonate and dimethyl carbonate (1:1 v/v) with 10 volume % fluoroethylene carbonate additive, and the cycling was conducted at 25° C. The cell was operated to determine the specific capacity of the $Si_{50}Sn_{25}Al_{25}$ composition to be intercalated with lithium (the specific charge capacity in milliamperes per hour per gram of lithium during charging of the $Si_{50}Sn_{25}Al_{25}$ composition. And in the reverse cycle, the cell was operated to remove the lithium from the $Si_{50}Sn_{25}Al_{25}$ composition. FIG. 4 is a graph of Specific Capacity (mAh/g) at the left vertical axis, and CE (coulombic efficiency) at the right vertical axis vs. Cycle Number, up to about 500 cell cycles, horizontal axis, for the composite of $Si_{50}Sn_{25}Al_{25}$ composition as anode material in a half-cell using pure lithium as the counter electrode. The solid data line represents the data points for specific charge capacity (mAh/g). The long-short dashed line represents the data points for specific discharge capacity (mAh/g). And the equal length dashed line represents the data points for CE. It is seen that the coulombic efficiency of the cell operation remained above 99.5% after 10 cycles. And the specific capacity of the composite material during both charging and discharging remained between 1200 to 1600 mAh/g throughout the 500 cycles.

Figure 7:
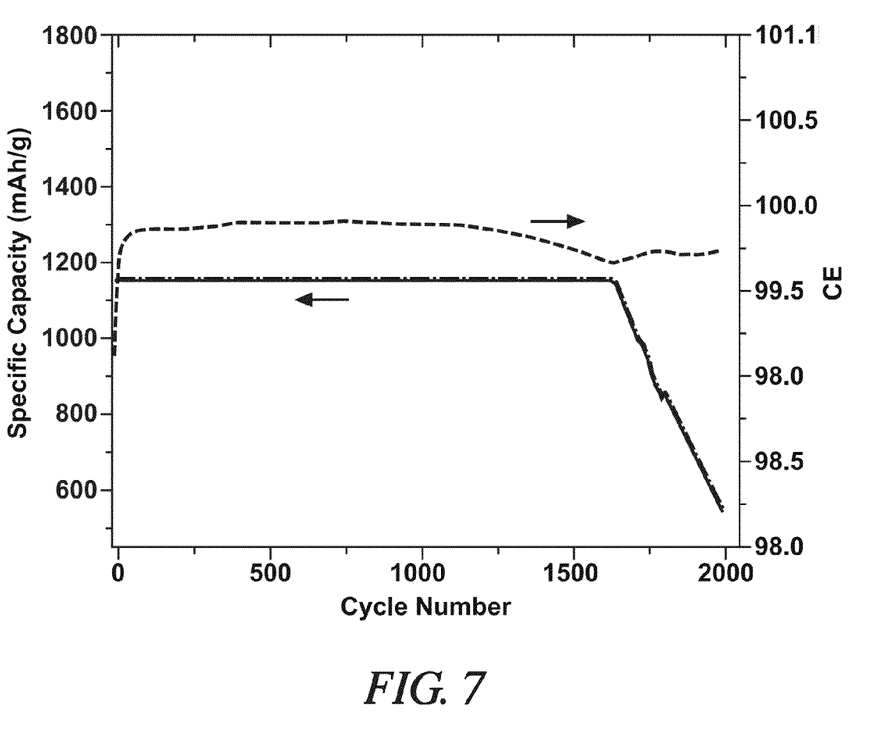
FIG. 7 is a graph of Specific Capacity (mAh/g), left vertical axis, and CE, right vertical axis vs. Cycle Number, up to about 2000 cell cycles, horizontal axis, for additional cycling of the FIG. 4 composite of $S_{i50}S_{n25}A_{l25}$ composition as anode material in a half-cell using pure lithium as the counter electrode, and the cycling was conducted at 25° C. The solid data line represents the data points for specific charge capacity (mAh/g). The long-short dashed line represents the data points for specific discharge capacity (mAh/g). And the equal length dashed line represents the data points for CE.

FIG. 7 presents additional data obtained with further cycling, up to 2000 charge/discharge cycles, of the above prepared $Si_{50}Sn_{25}Al_{25}$ composition as anode material in a half-cell, using pure lithium as the counter electrode. After the first several cycles the specific capacity values during charge and discharge cycles remained at about 1180 mAh/g until about 1600 cycles. The coulombic efficiency remained above 99.5% after five cycles.

Figure 5:
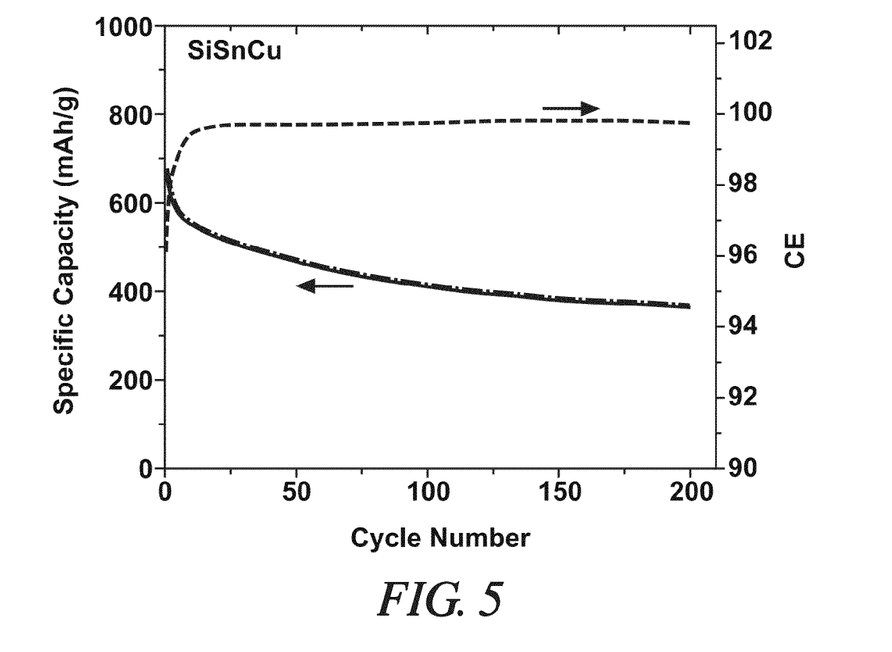
FIG. 5 is a graph of Specific Capacity (mAh/g), left vertical axis, and CE, right vertical axis vs. Cycle Number, up to about 500 cell cycles, horizontal axis, for a composite of $Si_{50}Sn_{25}Cu_{25}$ composition as anode material in a half-cell using pure lithium as the counter electrode. The electrolyte solution was 1 M $LiPF_6$ ethylene carbonate and dimethyl carbonate (1:1 v/v) with 10% fluoroethylene carbonate additive, and the cycling was conducted at 25° C. The solid data line represents the data points for specific charge capacity (mAh/g). The long-short dashed line represents the data points for specific discharge capacity (mAh/g). And equal length dashed line represents the data points for CE.

A composite of $Si_{50}Sn_{25}Cu_{25}$ composition was tested as the anode material in a half-cell using pure lithium as the counter electrode. The electrolyte solution was 1 M $LiPF_6$ ethylene carbonate and dimethyl carbonate (1:1 v/v) with 10 volume % fluoroethylene carbonate additive, and the cycling was conducted at 25° C. The cell was operated to determine the specific capacity of the $Si_{50}Sn_{25}Cu_{25}$ composition to be intercalated with lithium (the specific charge capacity in milliamperes per hour per gram of lithium during charging of the $Si_{50}Sn_{25}Al_{25}$ composition. And in the reverse cycle, the cell was operated to remove the lithium from the $Si_{50}Sn_{25}Cu_{25}$ composition. FIG. 5 is a graph of Specific Capacity (mAh/g) at the left vertical axis, and CE (coulombic efficiency) at the right vertical axis vs. Cycle Number, up to about 200 cell cycles, horizontal axis, for the composite of $Si_{50}Sn_{25}Cu_{25}$ composition as anode material in a half-cell using pure lithium as the counter electrode. The solid data line represents the data points for specific charge capacity (mAh/g). The long-short dashed line represents the data points for specific discharge capacity (mAh/g). And the equal length dashed line represents the data points for CE. It is seen that the coulombic efficiency of the cell operation remained above 99% after 20 cycles. And the specific capacity of the composite material, during both charging and discharging, started at a level of about 800 mAh/g. Then, it experienced continuous degrading because an intermetallic compound formed between the copper and tin.

Figure 6:
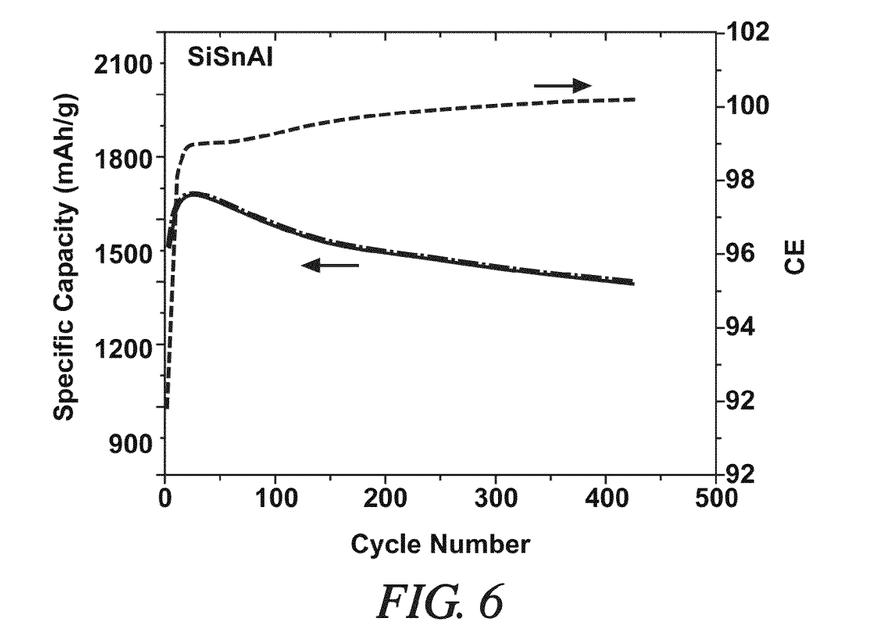
FIG. 6 is a graph of Specific Capacity (mAh/g), left vertical axis, and CE, right vertical axis vs. Cycle Number, up to about 500 cell cycles, horizontal axis, for a composite of $Si_{50}Sn_{25}Ti_{25}$ composition as anode material in a half-cell using pure lithium as the counter electrode. The electrolyte solution was 1 M $LiPF_6$ ethylene carbonate and dimethyl carbonate (1:1 v/v) with 10% fluoroethylene carbonate additive, and the cycling was conducted at 25° C. The solid data line represents the data points for specific charge capacity (mAh/g). The long-short dashed line represents the data points for specific discharge capacity (mAh/g). And the equal length dashed line represents the data points for CE.

A composite of $Si_{50}Sn_{25}Ti_{25}$ composition was tested as the anode material in a half-cell using pure lithium as the counter electrode. The electrolyte solution was 1 M $LiPF_6$ ethylene carbonate and dimethyl carbonate (1:1 v/v) with 10 volume % fluoroethylene carbonate additive, and the cycling was conducted at 25° C. The cell was operated to determine the specific capacity of the $Si_{50}Sn_{25}Ti_{25}$ composition to be intercalated with lithium (the specific charge capacity in milliamperes per hour per gram of lithium during charging of the $Si_{50}Sn_{25}Ti_{25}$ composition). And in the reverse cycle, the cell was operated to remove the lithium from the $Si_{50}Sn_{25}Ti_{25}$ composition. FIG. 6 is a graph of Specific Capacity (mAh/g) at the left vertical axis, and CE (coulombic efficiency) at the right vertical axis vs. Cycle Number, up to about 200 cell cycles, horizontal axis, for the composite of $Si_{50}Sn_{25}Cu_{25}$ composition as anode material in a half-cell using pure lithium as the counter electrode. The solid data line represents the data points for specific charge capacity (mAh/g). The long-short dashed line represents the data points for specific discharge capacity (mAh/g). And the equal length dashed line represents the data points for CE. It is seen that the coulombic efficiency of the cell operation remained above 99% after 50 cycles. And the specific capacity of the composite material during both charging and discharging started around 800 mAh/g. Then, the specific capacity experienced continuous degrading because an intermetallic compound formed between the titanium and tin.

The experimental data presented in FIGS. 4-7 show that the tested combination of silicon, tin, and aluminum served best among the three combinations tested. These tests show the importance of the silicon-tin-second metal element composite composition maintaining its phase-separated nanostructure and the appropriate oxide layer being formed on the surfaces of the materials.

In the above illustrative examples, the composite negative electrode materials were prepared by sputtering of the individual constituents onto a copper foil current collector. The phase separated silicon-tin-second metal compositions may also be prepared by a rapid solidification process from a homogenous melt of suitable proportions of silicon, tin, and aluminum (or the like). In general it is preferred to form composites of about 20 to 80 atomic percent silicon, about 20-60 atomic percent tin, and about 1 to 30 atomic percent of one of aluminum, copper, titanium, or other suitable lithium-accepting metal that is immiscible with silicon and tin. For example, the process may be practiced as follows, using the example of a composite of silicon, tin, and aluminum.

1. Silicon, tin, and aluminum are melted together in a predetermined atomic proportion, as specified above in this specification.

2. The melt is progressively rapidly solidified to form particles, flakes, or ribbons.

3. The particles are comminuted, such as by cryogenic ball milling at a suitably low temperature below 0° C. and down to −30° C. in inert atmosphere in order to avoid oxidation of the particles, to form generally uniformly shaped particles of one to five microns or so (or smaller) in largest dimension.

4. In some embodiments, the particles may be annealed, if necessary, to induce phase separation by forming nanoscale islands of amorphous silicon phases embedded in a matrix of separate phases of tin and aluminum. Such phase separated composite particles of silicon, tin, and aluminum are considered the active material for a negative electrode of a lithium-ion cell.

5. The particles of active material are bonded to a suitable metal current collector, preferably a copper current collector in forming a negative electrode. For example, particles of active electrode material may be mixed with a suitable polymeric binder, such as polyvinylidene difluoride (PVDF) or sodium alginate, and carbon black (a current conductor) in a weight ratio for example of 80:10:10. An inert liquid vehicle may be temporarily used for distributing the mixture over one or both opposing surfaces of a thin current collector strip. The liquid vehicle is removed and the mixture bonded to the collector film surfaces with the polymer binder. The electrical conductivity of the silicon-tin-aluminum composite is further increased by the particles of carbon black.

Thus, the phase separated films are suitably formed over a predetermined area and to a determined thickness on a copper current collector for assembly as the negative electrode material into lithium-ion electrochemical cells or lithium-sulfur electrochemical cells. Lithium may be introduced into the silicon-tin-aluminum composite during the making of the electrode or during initial charging or other operation of the cell. The total amount of the negative electrode material and its lithium content is selected to provide a desired electrode capacity.

Practices of the invention have been described for purposes of illustration and not of limitation of the scope of the invention.

The invention claimed is:

1. A lithium-ion or lithium-sulfur secondary electrochemical cell or battery comprising a negative electrode composition utilizing lithium; the lithium being inserted into a negative electrode composition during charging of the cell or battery and lithium being extracted from the negative electrode composition during discharge of the cell or battery; the negative electrode material comprising a composite consisting of silicon, tin, and a second metal element selected from the group consisting of aluminum, copper, and titanium, the composite being further characterized in that the silicon, tin, and second metal are present separately in separate phases, the tin phase and the second metal element phase being crystalline or amorphous and the silicon phase being amorphous, the composite of silicon, tin, and a second metal element being further characterized by nanoscale islands of amorphous silicon phase dispersed in a matrix of a tin phase and a phase of the second metal element.

2. A lithium-ion or lithium-sulfur secondary electrochemical cell or battery as recited in claim 1 in which the second metal element is aluminum.

3. A lithium-ion or lithium-sulfur secondary electrochemical cell or battery as recited in claim 1 in which the composite of silicon, tin, and the second metal element consists of twenty to eighty atomic percent silicon, twenty to sixty atomic percent tin, and one to thirty atomic percent of the second metal element.

4. A lithium-ion or lithium-sulfur secondary electrochemical cell or battery as recited in claim 1 in which the composite of silicon, tin, and the second metal element is characterized by tin phase crystals and second metal element phase crystals each having a size in the range of twenty nanometers to fifty nanometers.

5. A lithium-ion or lithium-sulfur secondary electrochemical cell or battery as recited in claim 1 in which the composite of silicon, tin, and the second metal element was formed as an adherent film by sputtering of silicon, tin, and the second metal element onto a surface of a metal current collector for the negative electrode material, the sputtered film having a thickness up to about five micrometers.

6. A lithium-ion or lithium-sulfur secondary electrochemical cell or battery as recited in claim 2 in which the composite of silicon, tin, and aluminum was formed as an adherent film by sputtering of silicon, tin, and aluminum onto a surface of a metal current collector for the negative electrode material, the sputtered film having a thickness up to about five micrometers.

7. A lithium-ion or lithium-sulfur secondary electrochemical cell or battery as recited in claim 1 in which the composite of silicon, tin, and the second metal element was formed by rapid solidification of a molten liquid of silicon, tin, and the second metal element into solid particles of the phase separated composite of silicon, tin, and the second metal element, the solid particles being reduced in size to about one to five micrometers by ball milling at a temperature below 0° C. and down to −30° C. in an inert atmosphere, and then mixed with a polymeric binder and bonded to a metal current collector for the negative electrode material.

8. A lithium-ion or lithium-sulfur secondary electrochemical cell or battery as recited in claim 1 in which a composite of silicon, tin, and aluminum was formed by rapid solidification of a molten liquid of silicon, tin, and aluminum into solid particles of the phase-separated composite of silicon, tin, and aluminum, the solid particles being reduced in size to about one to five micrometers and then mixed with a polymeric binder and carbon black and bonded to a metal current collector for the negative electrode material.

9. A lithium-sulfur secondary electrochemical cell or battery as recited in claim 1, the negative electrode material comprising, prior to initial charging of the cell or battery, a composite of silicon, tin, and a second metal element that contains inserted lithium.

10. A lithium-ion or lithium-sulfur secondary electrochemical cell or battery comprising a negative electrode composition and a positive electrode composition; lithium being inserted into the negative electrode composition and extracted from the positive electrode composition by transport of lithium through a lithium-containing electrolyte during charging of the cell or battery, and lithium being extracted from the negative electrode composition and inserted into the positive electrode composition by transport of lithium through a lithium-containing electrolyte during discharge of the cell or battery; the negative electrode material comprising a composite consisting of silicon, tin, and a second metal element selected from the group consisting of aluminum, copper, and titanium, the composite being further characterized in that the silicon, tin, and second metal element are present separately in separate phases, the tin phase and the second metal element phase being crystalline or amorphous and the silicon phase being amorphous, the composite of silicon, tin, and a second metal element being further characterized by nanoscale islands of amorphous silicon phase dispersed in a matrix of a tin phase and a phase of the second metal element.

11. A lithium-ion or lithium-sulfur secondary electrochemical cell or battery as recited in claim 10 in which in which the second metal element is aluminum.

12. A lithium-ion or lithium-sulfur secondary electrochemical cell or battery as recited in claim 10 in which the composite of silicon, tin, and the second metal element consists of twenty to eighty atomic percent silicon, twenty to sixty atomic percent tin, and one to thirty atomic percent of the second metal element.

13. A lithium-ion or lithium-sulfur secondary electrochemical cell or battery as recited in claim 10 in which the composite of silicon, tin, and the second metal element is characterized by tin phase crystals and second metal element phase crystals each having a size in the range of twenty nanometers to fifty nanometers.

14. A lithium-ion or lithium-sulfur secondary electrochemical cell or battery as recited in claim 10 in which the composite of silicon, tin, and the second metal element was formed as an adherent film by sputtering of silicon, tin, and the second metal element onto a surface of a metal current collector for the negative electrode material, the sputtered film having a thickness up to about five micrometers.

15. A lithium-ion or lithium-sulfur secondary electrochemical cell or battery as recited in claim 11 in which the composite of silicon, tin, and aluminum was formed as an adherent film by sputtering of silicon, tin, and aluminum onto a surface of a metal current collector for the negative electrode material, the sputtered film having a thickness up to about five micrometers.

16. A lithium-ion or lithium-sulfur secondary electrochemical cell or battery as recited in claim 10 in which the composite of silicon, tin, and the second metal element was formed by rapid solidification of a molten liquid of silicon, tin, and the second metal element into solid particles of the phase-separated composite of silicon, tin, and the second metal element, the solid particles being reduced in size to about one to five micrometers by ball milling at a temperature below 0° C. and down to −30° C. in an inert atmosphere, and then mixed with a polymeric binder and bonded to a metal current collector for the negative electrode material.

17. A lithium-ion or lithium-sulfur secondary electrochemical cell or battery as recited in claim 11 in which the composite of silicon, tin, and aluminum was formed by rapid solidification of a molten liquid of silicon, tin, and aluminum into solid particles of the phase-separated composite of silicon, tin, and aluminum, the solid particles being reduced in size to about one to five micrometers and then mixed with a polymeric binder and carbon black and bonded to a metal current collector for the negative electrode material.

18. A lithium-sulfur secondary electrochemical cell or battery as recited in claim 10, the negative electrode material comprising, prior to initial charging of the cell or battery, a composite of silicon, tin, and a second metal element that contains inserted lithium.

* * * * *